US012647101B2

(12) United States Patent
Yoshioka

(10) Patent No.: US 12,647,101 B2
(45) Date of Patent: Jun. 2, 2026

(54) COMPOUND FILTER DEVICE

(71) Applicant: Murata Manufacturing Co., Ltd., Nagaokakyo (JP)

(72) Inventor: Hiroyuki Yoshioka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 90 days.

(21) Appl. No.: 18/884,551

(22) Filed: Sep. 13, 2024

(65) Prior Publication Data

US 2025/0007495 A1 Jan. 2, 2025

Related U.S. Application Data

(63) Continuation of application No. PCT/JP2023/010928, filed on Mar. 20, 2023.

(30) Foreign Application Priority Data

Mar. 29, 2022 (JP) ................................. 2022-053053

(51) Int. Cl.
*H03H 9/54* (2006.01)
*H03H 9/05* (2006.01)
(Continued)

(52) U.S. Cl.
CPC .............. *H03H 9/542* (2013.01); *H03H 9/05* (2013.01); *H03H 9/133* (2013.01); *H03H 9/58* (2013.01)

(58) Field of Classification Search
CPC ........ H03H 9/725; H03H 9/6483; H03H 9/25; H03H 9/72; H03H 9/0576; H03H 9/64;
(Continued)

(56) References Cited

U.S. PATENT DOCUMENTS 7,619,491 B2 11/2009 Takata et al.
2012/0280768 A1 11/2012 Nakayama et al.
(Continued)

FOREIGN PATENT DOCUMENTS

JP 2014140249 A 7/2014
JP 2016518792 A 6/2016
(Continued)

OTHER PUBLICATIONS

International Search Report in PCT/JP2023/010928, mailed Jun. 13, 2023, 2 pages.
(Continued)

*Primary Examiner* — Lincoln D Donovan
*Assistant Examiner* — Tyler J Pereny
(74) *Attorney, Agent, or Firm* — Keating & Bennett, LLP

(57) ABSTRACT

A compound filter device includes a piezoelectric substrate, a first filter that is a band pass filter and includes a longitudinally coupled resonator acoustic wave filter on the piezoelectric substrate, and a second filter including at least one resonator, and an inductor connected to a ground potential. In a plan view, the longitudinally coupled resonator acoustic wave filter and the inductor overlap to define an overlapping portion, and a direction in which current flows through the longitudinally coupled resonator acoustic wave filter and a direction in which current flows through the inductor are the same in the overlapping portion.

20 Claims, 9 Drawing Sheets

(51) Int. Cl.
   *H03H 9/13*       (2006.01)
   *H03H 9/58*       (2006.01)

(58) Field of Classification Search
   CPC ...... H03H 9/542; H03H 9/145; H03H 9/0085;
        H03H 9/605; H03H 9/6476; H03H 9/54;
        H03H 9/568; H03H 9/6489; H03H 9/706;
        H03H 9/0071; H03H 9/02748; H03H
        9/14576; H03H 9/14526; H03H 9/14532;
        H03H 9/14582; H03H 9/14585; H03H
        9/14588; H03H 9/02559; H03H 9/6436;
        H03H 9/008; H03H 9/02574; H03H
        9/0557; H03H 9/6433; H03H 9/70; H03H
        9/205; H01F 38/14; H01F 27/2823; H01F
        17/00; H01F 27/00
   See application file for complete search history.

(56)            References Cited

U.S. PATENT DOCUMENTS

| | | | |
|---|---|---|---|
| 2016/0072476 A1 | 3/2016 | Koch et al. | |
| 2018/0302061 A1* | 10/2018 | Sugaya ................ | H03H 9/1085 |
| 2021/0083700 A1* | 3/2021 | Muranaka .............. | H04B 1/006 |

FOREIGN PATENT DOCUMENTS

| | | | |
|---|---|---|---|
| WO | 2007145049 A1 | 12/2007 | |
| WO | 2013141183 A1 | 9/2013 | |
| WO | 2017110993 A1 | 6/2017 | |

OTHER PUBLICATIONS

Written Opinion in PCT/JP2023/010928, mailed Jun. 13, 2023, 3 pages.

* cited by examiner

COMPOUND FILTER DEVICE

CROSS REFERENCE TO RELATED APPLICATIONS

This application claims the benefit of priority to Japanese Patent Application No. 2022-053053 filed on Mar. 29, 2022 and is a Continuation Application of PCT Application No. PCT/JP2023/010928 filed on Mar. 20, 2023. The entire contents of each application are hereby incorporated herein by reference.

BACKGROUND OF THE INVENTION

1. Field of the Invention

The present invention relates to compound filter devices.

2. Description of the Related Art

Compound filter devices including an acoustic wave resonator have widely been used as filters for mobile phones. International Publication No. 2013/141183 discloses an example of an acoustic wave splitter serving as a compound filter device. This acoustic wave splitter includes two band pass filters. The two band pass filters are connected in common to an antenna terminal. Specifically, the two band pass filters are a transmission filter chip and a reception filter chip. The transmission filter chip and the reception filter chip are flip-chip mounted on a circuit board.

The circuit board includes multiple dielectric layers. An inductor is disposed on the multiple dielectric layers. The inductor is connected between the antenna terminal and a ground potential. The inductor is used for impedance matching.

Each band pass filter described in International Publication No. 2013/141183 may fail to fully increase out-of-band attenuation.

SUMMARY OF THE INVENTION

Example embodiments of the present invention provide compound filter devices that each increase out-of-band attenuation of a band pass filter.

A compound filter device according to an example embodiment of the present invention includes a piezoelectric substrate, a first filter defining and functioning as a band pass filter and including a longitudinally coupled resonator acoustic wave filter on the piezoelectric substrate, and a second filter including at least one resonator, and an inductor connected to a ground potential. In a plan view, the longitudinally coupled resonator acoustic wave filter and the inductor overlap to define an overlapping portion, and a direction in which current flows through the longitudinally coupled resonator acoustic wave filter and a direction in which current flows through the inductor are the same in the overlapping portion.

A compound filter device according to an example embodiment of the present invention includes a piezoelectric substrate, a first filter defining and functioning as a band pass filter, and including a longitudinally coupled resonator acoustic wave filter on the piezoelectric substrate, and a second filter including at least one resonator, and an inductor connected to a ground potential. The longitudinally coupled resonator acoustic wave filter r includes a plurality of IDT electrodes on the piezoelectric substrate, the plurality of IDT electrodes each including a plurality of electrode fingers. In a plan view, the longitudinally coupled resonator acoustic wave filter and the inductor overlap to define an overlapping portion, and a direction in which the electrode fingers in the longitudinally coupled resonator acoustic wave filter extend and a direction in which current flows through the inductor are the same in the overlapping portion.

Compound filter devices according to example embodiments of the present invention increase out-of-band attenuation of a band pass filter.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Hereafter, with reference to the drawings, specific example embodiments of the present invention are described to clarify the present invention.

Example embodiments described herein are mere examples, and components between different example embodiments may be partially replaced with one another or combined with one another.

Figure 1:
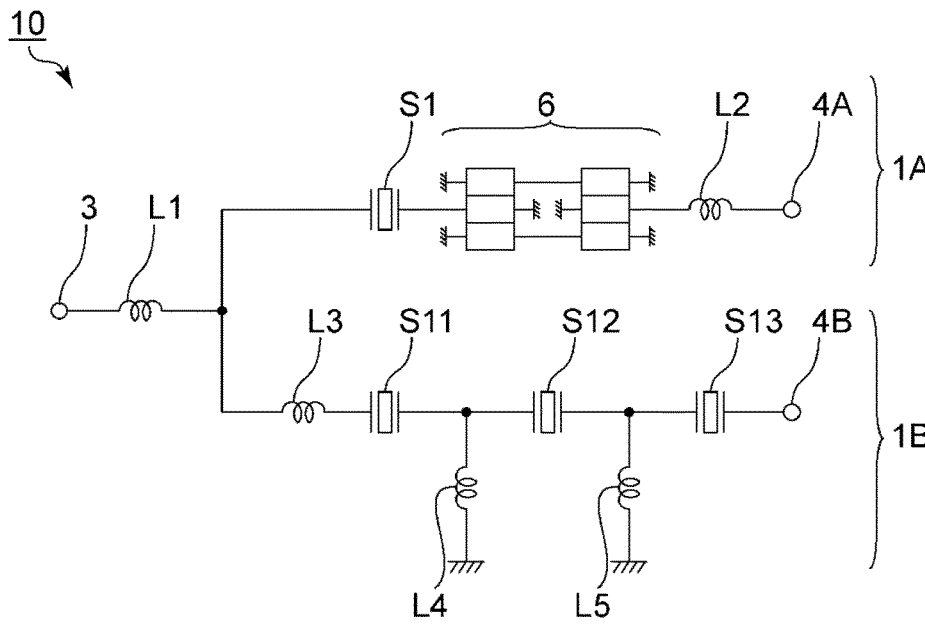
FIG. 1 is a circuit diagram of a compound filter device according to an example embodiment of the present invention.

FIG. 1 is a circuit diagram of a compound filter device according to an example embodiment of the present invention.

A compound filter device 10 includes a common connection terminal 3, a first filter 1A, and a second filter 1B. The first filter 1A and the second filter 1B are connected in common to the common connection terminal 3. In the present example embodiment, the common connection terminal 3 is, for example, an antenna terminal. The antenna terminal is connected to an antenna. An inductor L1 is connected to the common connection terminal 3 and between the first filter 1A and the second filter 1B.

The first filter 1A is a band pass filter. More specifically, the first filter 1A is a reception filter. On the other hand, the second filter 1B is a band elimination filter. Thus, the compound filter device 10 is an extractor.

The first filter 1A includes a first signal terminal 4A, a longitudinally coupled resonator acoustic wave filter 6, an acoustic wave resonator S1, and an inductor L2. The longitudinally coupled resonator acoustic wave filter 6 is connected between the common connection terminal 3 and the first signal terminal 4A. In the present example embodiment, the longitudinally coupled resonator acoustic wave filter 6 includes, for example, two stages of three interdigital transducers (IDTs). However, the configuration of the longitudinally coupled resonator acoustic wave filter 6 is not limited to the above. The acoustic wave resonator S1: connected between the longitudinally coupled resonator acoustic wave filter 6 and the common connection terminal 3. The inductor L2 is connected between the longitudinally coupled resonator acoustic wave filter 6 and the first signal terminal 4A.

The second filter 1B includes a second signal terminal 4B, multiple acoustic wave resonators, and multiple inductors. More specifically, the multiple acoustic wave resonators in the second filter 1B include an acoustic wave resonator S11, an acoustic wave resonator S12, and an acoustic wave resonator S13. The acoustic wave resonator S11, the acoustic wave resonator S12, and the acoustic wave resonator S13 are connected in series between the common connection terminal 3 and the second signal terminal 4B.

More specifically, the multiple inductors of the second filter 1B include an inductor L3, an inductor L4, and an inductor L5. The inductor L3 is connected between the common connection terminal 3 and the acoustic wave resonator S11. The inductor L4 is connected between a ground potential and a node between the acoustic wave resonator S11 and the acoustic wave resonator S12. The inductor L5 is connected between a ground potential and a node between the acoustic wave resonator S12 and the acoustic wave resonator S13. A circuit configuration of the compound filter device 10 is not limited to the above.

The first filter 1A is a band pass filter that outputs, to the first signal terminal 4A, signals of frequencies in a predetermined band of signals received from the common connection terminal 3. The second filter 1B is a band elimination filter that outputs, to the second signal terminal 4B, signals of frequencies in a predetermined band of signals received from the common connection terminal 3. The first filter 1A and the second filter 1B are included in an acoustic wave element chip. Hereafter, a specific configuration of the compound filter device 10 is described.

Figure 2:
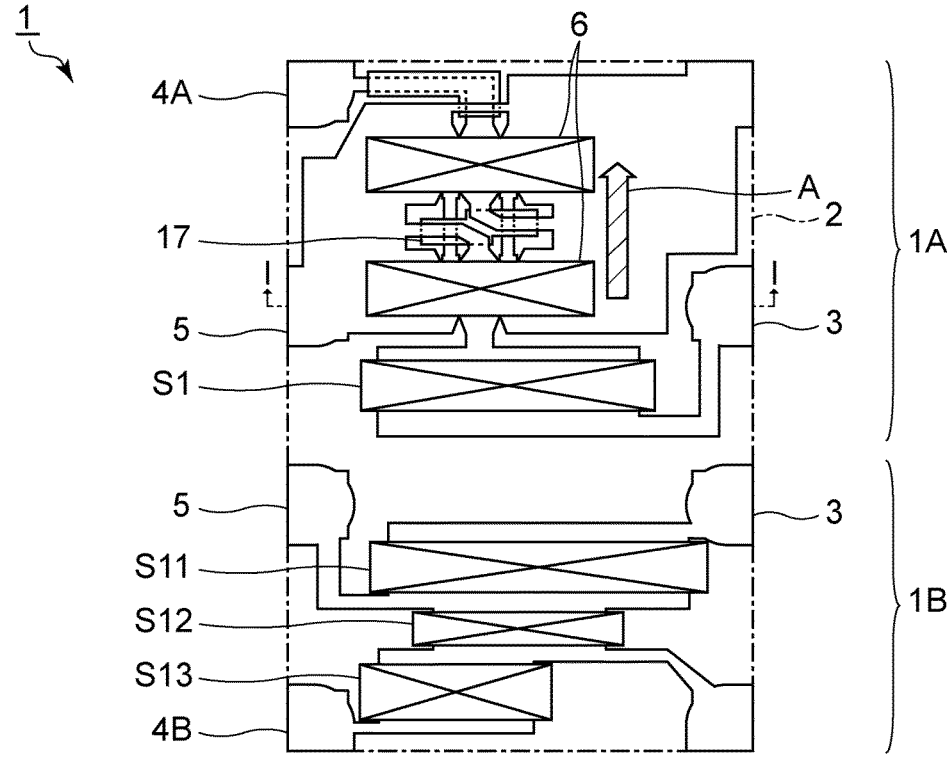
FIG. 2 is a schematic perspective plan view of an acoustic wave element chip according to an example embodiment of the present invention.

FIG. 2 is a schematic perspective plan view of an acoustic wave element chip according to the present example embodiment. In FIG. 2, resonators are each schematically indicated with a rectangle with two diagonals. The same applies to schematic plan views, schematic bottom views, and schematic cross-sectional views, described below.

An acoustic wave element chip 1 in the compound filter device 10 includes a piezoelectric substrate 2. In the present example embodiment, the piezoelectric substrate 2 is a substrate simply including a piezoelectric material. Examples of a piezoelectric material include lithium tantalate, lithium niobate, zinc oxide, aluminum nitride, crystal, and lead zirconate titanate (PZT). Alternatively, the piezoelectric substrate 2 may be a laminate substrate including a piezoelectric layer.

The resonators of the compound filter device 10 are disposed on the piezoelectric substrate 2. The terminals of the compound filter device 10 are disposed on the piezoelectric substrate 2 as electrode pads. The common connection terminal 3 of the first filter 1A and the common connection terminal 3 of the second filter 1B are disposed on the piezoelectric substrate 2. The two common connection terminals 3 share a portion that is not located on the piezoelectric substrate 2. Multiple ground terminals 5 are further disposed on the piezoelectric substrate 2. The ground terminals 5 are connected to a ground potential.

Through the longitudinally coupled resonator acoustic wave filter 6, signals flow in a direction of arrow A in FIG. 2. More specifically, through the longitudinally coupled resonator acoustic wave filter 6, signals flow from the common connection terminal 3 toward the first signal terminal 4A. Herein, the direction in which signals flow through the longitudinally coupled resonator acoustic wave filter 6 is referred to as a direction in which current flows through the longitudinally coupled resonator acoustic wave filter 6.

Although the configuration of the longitudinally coupled resonator acoustic wave filter 6 is described in detail later, the direction in which current flows through the longitudinally coupled resonator acoustic wave filter 6 is parallel or substantially parallel to the direction in which electrode fingers of the longitudinally coupled resonator acoustic wave filter 6 extend. The direction in which current flows through the longitudinally coupled resonator acoustic wave filter 6 is a direction in the longitudinally coupled resonator acoustic wave filter 6 from a busbar connected to an input wire toward a busbar connected to an output wire.

Figure 3:
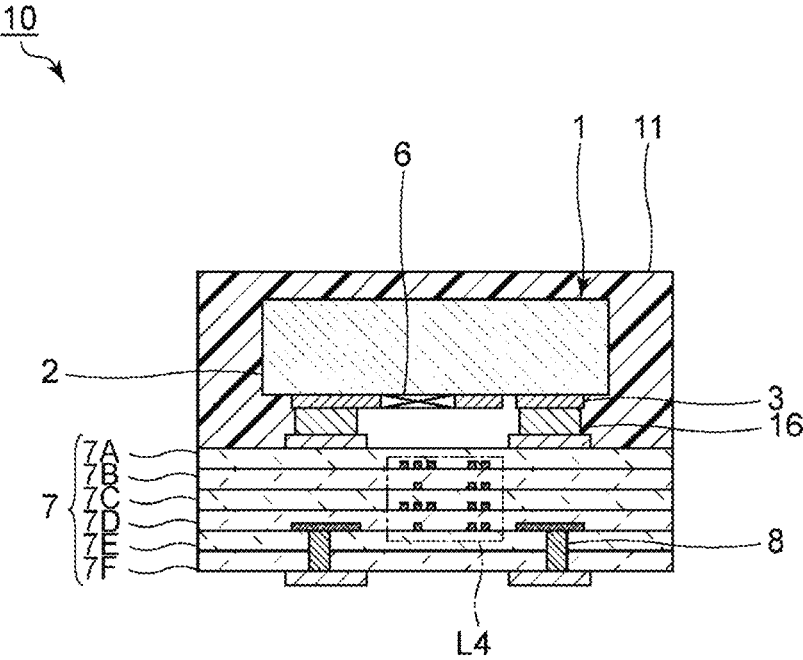
FIG. 3 is a schematic front cross-sectional view of a compound filter device according to an example embodiment of the present invention.

FIG. 3 is a schematic front cross-sectional view of a compound filter device according to an example embodiment of the present invention. FIG. 3 is a schematic cross-sectional view of a portion taken along line I-I in FIG. 2.

The compound filter device 10 includes a mount board 7. The acoustic wave element chip 1 is flip-chip mounted on the mount board 7. The mount board 7 is, for example, a six-layer laminate board. More specifically, the mount board 7 includes a first layer 7A, a second layer 7B, a third layer 7C, a fourth layer 7D, a fifth layer 7E, and a sixth layer 7F laminated in this order. Of the multiple layers, the first layer 7A is located nearest the piezoelectric substrate 2. In the present example embodiment, each layer of the mount board 7 is, for example, a dielectric layer. Instead, each layer may be made from any appropriate material such as ceramics, for example. The mount board 7 may include any number of layers other than six layers.

Figure 4:
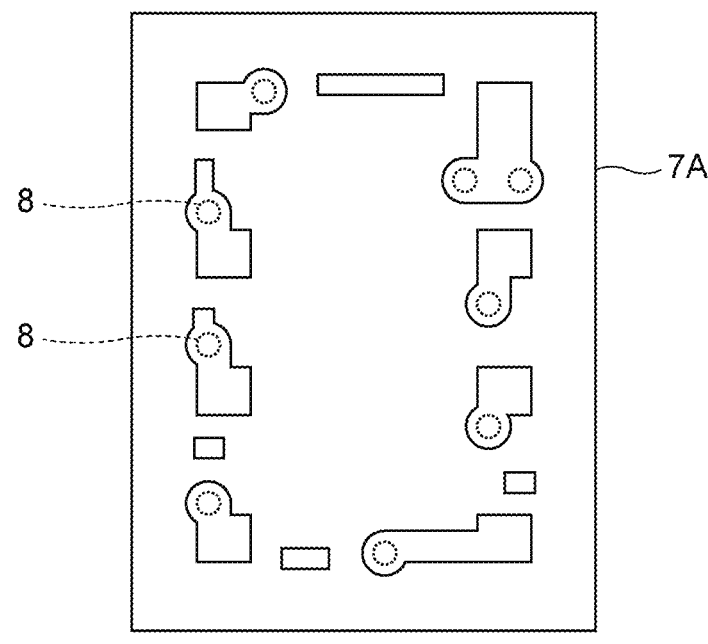
FIG. 4 is a plan view of an electrode structure of a first layer of a mount board according to an example embodiment of the present invention.
Figure 5:
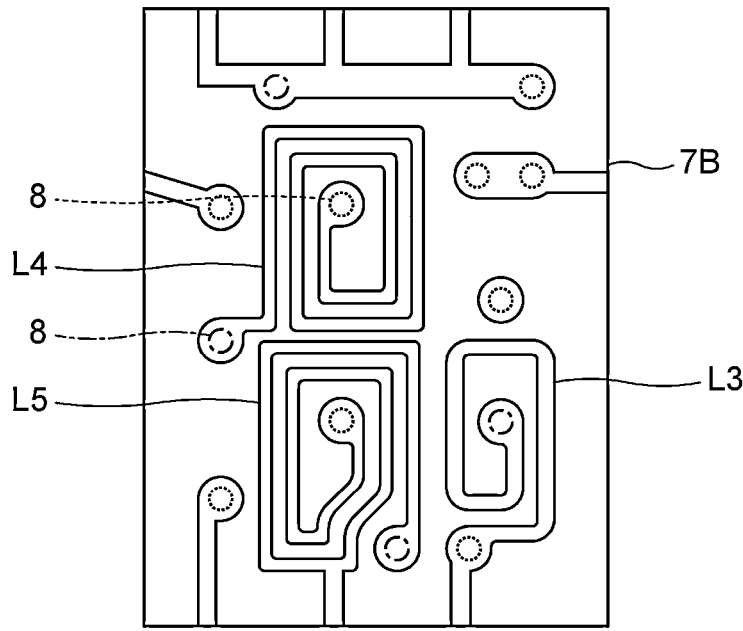
FIG. 5 is a plan view of an electrode structure of a second layer of a mount board according to an example embodiment of the present invention.
Figure 6:
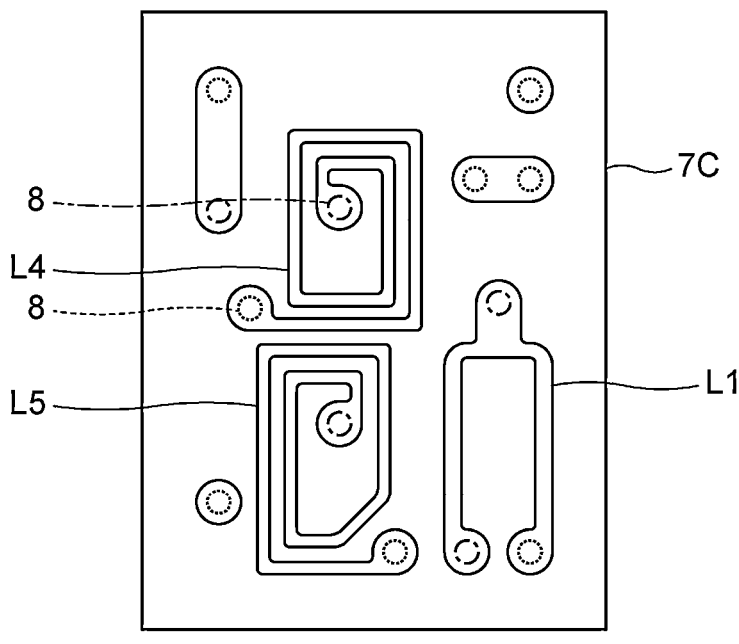
FIG. 6 is a plan view of an electrode structure of a third layer of a mount board according to an example embodiment of the present invention.
Figure 7:
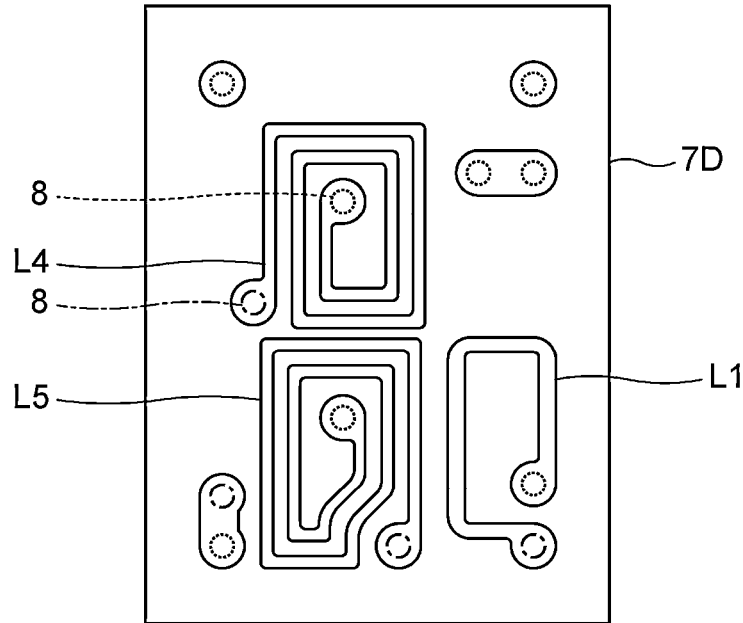
FIG. 7 is a plan view of an electrode structure of a fourth layer of a mount board according to an example embodiment of the present invention.
Figure 8:
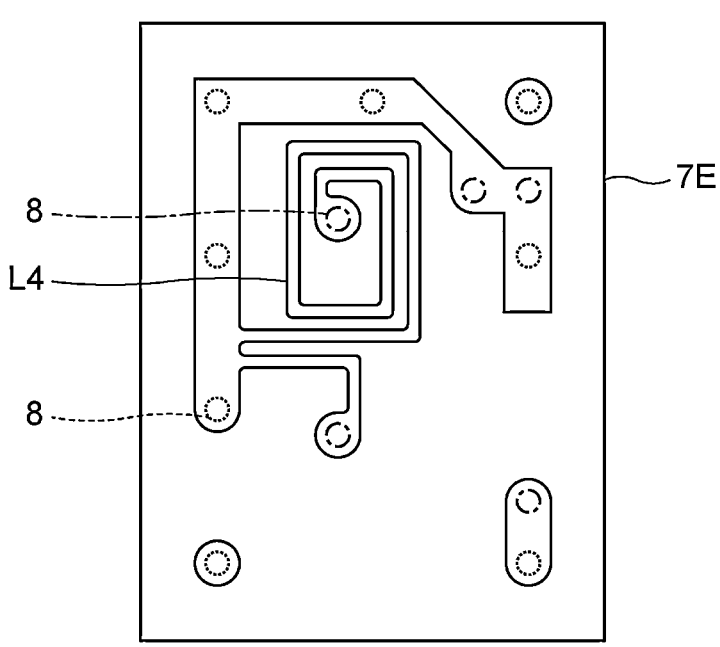
FIG. 8 is a plan view of an electrode structure of a fifth layer of a mount board according to an example embodiment of the present invention.
Figure 9:
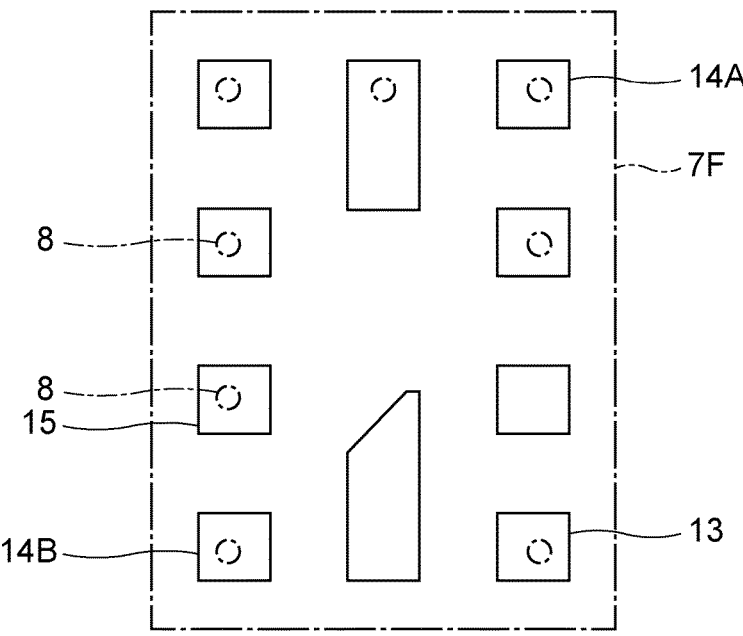
FIG. 9 is a perspective plan view of an electrode structure of a sixth layer of a mount board according to an example embodiment of the present invention.

FIG. 4 is a plan view of an electrode structure of the first layer of the mount board according to the present example embodiment. FIG. 5 is a plan view of an electrode structure of the second layer of the mount board according to the present example embodiment. FIG. 6 is a plan view of an electrode structure of the third layer of the mount board according to the present example embodiment. FIG. 7 is a plan view of an electrode structure of the fourth layer of the mount board according to the present example embodiment. FIG. 8 is a plan view of an electrode structure of the fifth layer of the mount board according to the present example embodiment. FIG. 9 is a schematic plan view of an electrode structure of the sixth layer of the mount board according to the present example embodiment.

As illustrated in FIG. 4 to FIG. 9, a wiring electrode is disposed on each layer of the mount board 7. Multiple through electrodes 8 are disposed in the mount board 7. The wiring electrodes on the layers are electrically connected to each other with the through electrodes 8. A subset of the multiple wiring electrodes defines inductors in the first filter 1A and the second filter 1B. For example, as shown in FIG. 5 to FIG. 8, the inductor L4 in the second filter 1B is disposed on the second layer 7B, the third layer 7C, the fourth layer 7D, and the fifth layer 7E. Thus, the inductor L4 is defined by a coil-shaped inductor.

The compound filter device 10 includes an overlapping portion. More specifically, the overlapping portion is a portion where the longitudinally coupled resonator acoustic wave filter 6 and the inductor L4 overlap each other in a plan view. Herein, a plan view indicates a view of the compound filter device 10 from above in FIG. 3 to below in FIG. 3. In contrast, a bottom view indicates a view of the compound filter device 10 from below in FIG. 3 to above in FIG. 3. With regard to the directions in FIG. 3, in relation to the piezoelectric substrate 2 and the mount board 7, the direction toward the piezoelectric substrate 2 is referred to as above, and the direction toward the mount board 7 is referred to as below.

Figure 10:
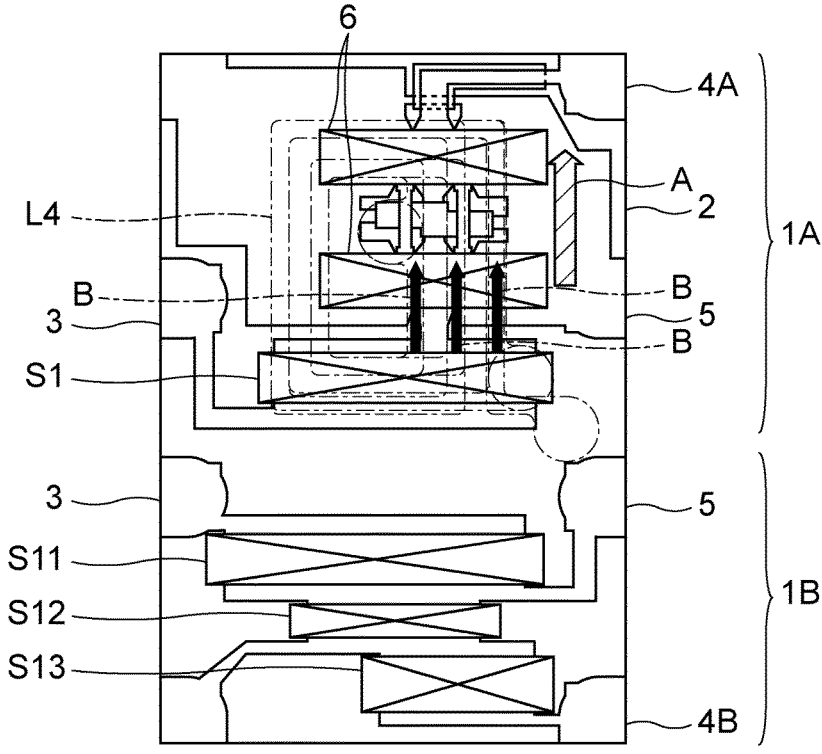
FIG. 10 is a schematic bottom view of a positional relationship between an inductor of a second filter and a longitudinally coupled resonator acoustic wave filter of a first filter according to an example embodiment of the present invention.

FIG. 10 is a schematic bottom view of a positional relationship between an inductor of a second filter and a longitudinally coupled resonator acoustic wave filter of the first filter according to the present example embodiment. FIG. 10 illustrates only the inductor L4 of the multiple inductors in the second filter 1B. FIG. 10 is a bottom view, illustrating a layout laterally reverse to the plan view in, for example, FIG. 2.

Current spirally flows through the inductor L4. More specifically, as in the inductor L4, the direction in which current flows through an inductor disposed in a parallel-arm resonator is a direction from a series-arm resonator toward a ground potential. In other words, the direction in which current flows through the inductor is a direction from the hot potential toward the ground potential. Herein, the hot potential indicates a signal potential. As in the inductor L3, the direction in which current flows through the inductor disposed in the series-arm resonator is a direction from an input end of the series-arm resonator toward an output end of the series-arm resonator.

In the overlapping portion in the compound filter device 10, current flows through the inductor L4 in a direction indicated by arrow B in FIG. 10. In contrast, as described above, current flows through the longitudinally coupled resonator acoustic wave filter 6 in a direction indicated by arrow A. The direction indicated by arrow A is parallel or substantially parallel to the direction in which the electrode fingers in the longitudinally coupled resonator acoustic wave filter 6 extend.

In the present example embodiment, current flows through the longitudinally coupled resonator acoustic wave filter 6 and the direction in which current flows through the inductor L4 are the same in the overlapping portion. More specifically, in the present example embodiment, in the overlapping portion, the direction in which the electrode fingers in the longitudinally coupled resonator acoustic wave filter 6 extend and the direction in which current flows through the inductor L4 are the same. Thus, out-of-band attenuation of the first filter 1A, defining and functioning as a band pass filter, can be increased. When an absolute value of an angle between arrow A and arrows B in FIG. 10 is, for example, smaller than or equal to about 15°, the direction in which current flows through the longitudinally coupled resonator acoustic wave filter 6 and the direction in which current flows through the inductor L4 may be regarded as the same. Similarly, when an absolute value of an angle between arrow A and arrows B is, for example, smaller than or equal to about 15°, the direction in which the electrode fingers in the longitudinally coupled resonator acoustic wave filter 6 extend and the direction in which current flows through the inductor L4 may be regarded as the same. Preferably, an absolute value of an angle between arrow A and arrows B is, for example, smaller than or equal to about 5°. The advantageous effects of the above configuration are described in detail by comparing the present example embodiment and a first reference example and a second reference example.

Figure 11:
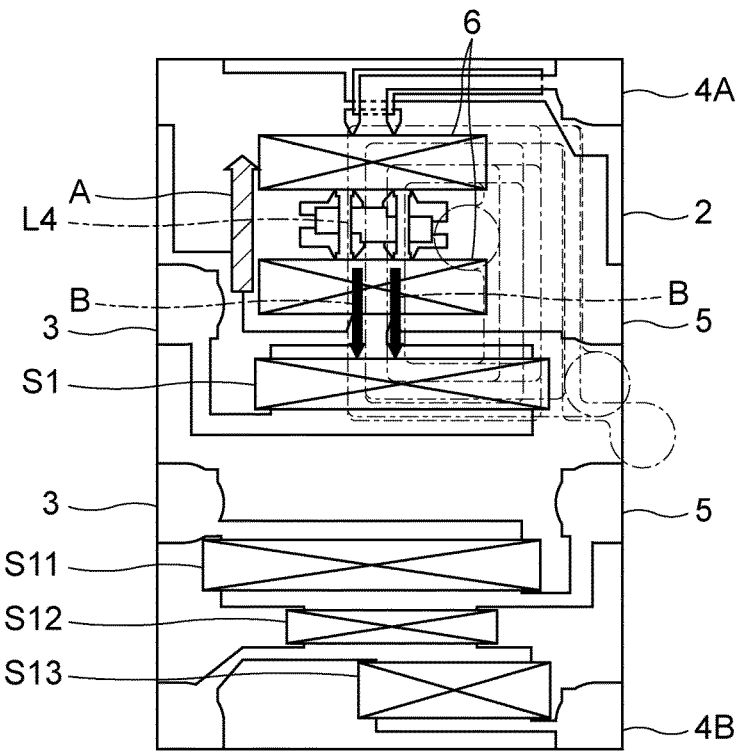
FIG. 11 is a schematic bottom view of a positional relationship between an inductor of a second filter and a longitudinally coupled resonator acoustic wave filter of a first filter according to a first reference example.

As illustrated in FIG. 11, the first reference example differs from the present example embodiment in that, in the overlapping portion, the direction in which current flows through the longitudinally coupled resonator acoustic wave filter 6 and the direction in which current flows through the inductor L4 are opposite to each other. Although not illustrated, the second reference example differs from the present example embodiment in that, in the overlapping portion, the direction in which current flows through the longitudinally coupled resonator acoustic wave filter 6 and the direction in which current flows through the inductor L4 are partially reverse to each other and partially the same. A first filter and a second filter in each of the compound filter devices according to the present example embodiment, the first reference example, and the second reference example undergo measurement of attenuation frequency characteristics.

Figure 12:
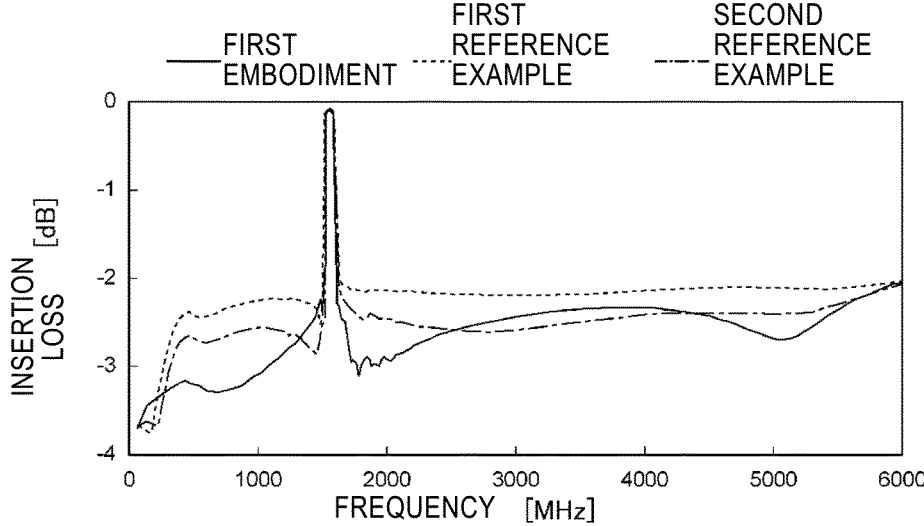
FIG. 12 is a diagram of attenuation frequency characteristics, in a wide frequency range, of first filters according to an example embodiment of the present invention, the first reference example, and a second reference example.
Figure 13:
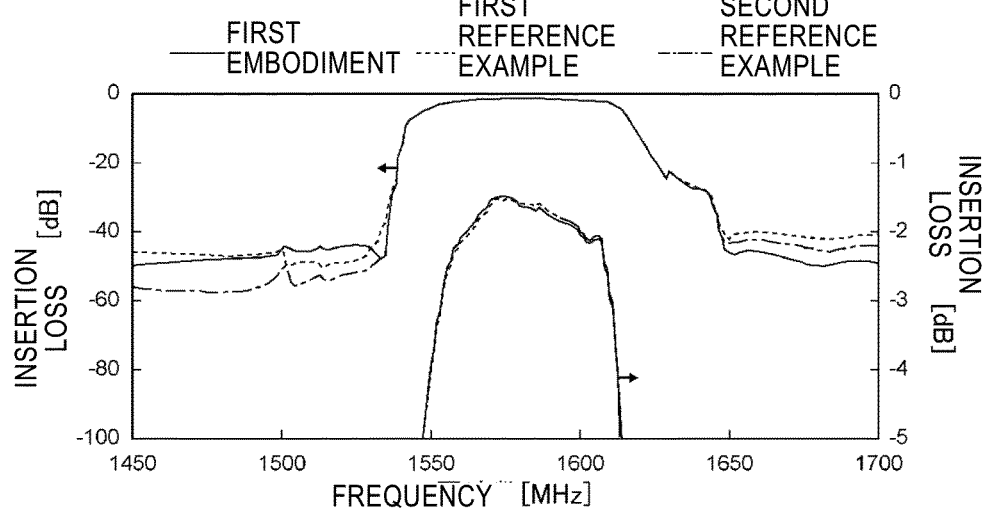
FIG. 13 is a diagram of attenuation frequency characteristics, around a pass band, of the first filters according to an example embodiment of the present invention, the first reference example, and the second reference example.
Figure 14:
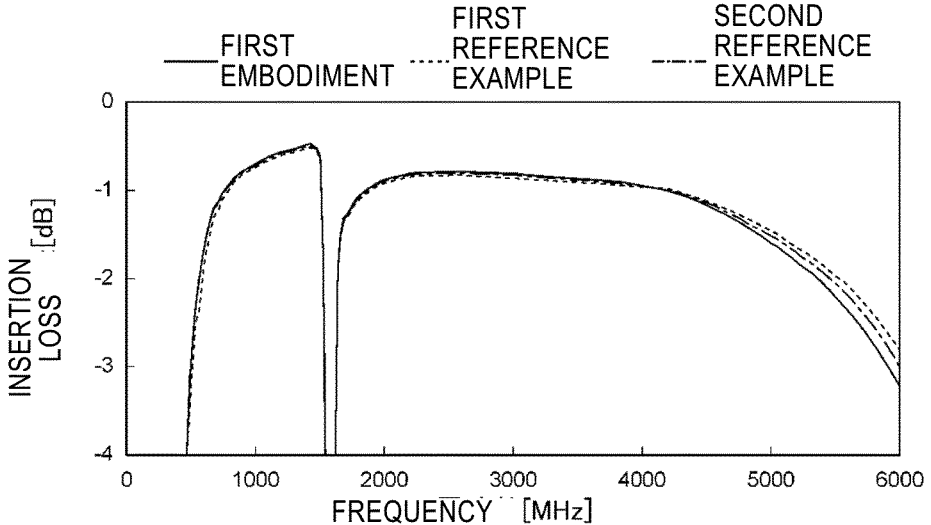
FIG. 14 is a diagram of attenuation frequency characteristics, in a wide frequency range, of second filters according to an example embodiment of the present invention, the first reference example, and the second reference example.
Figure 15:
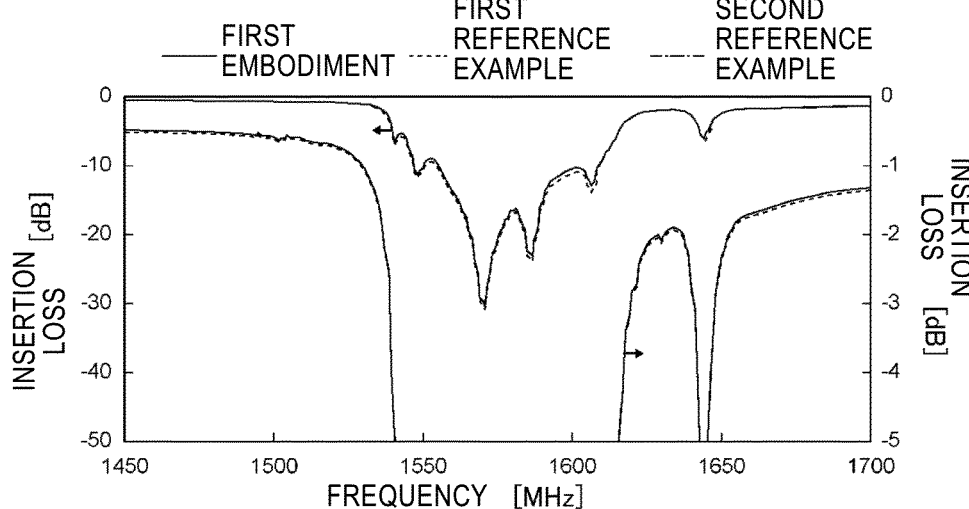
FIG. 15 is a diagram of attenuation frequency characteristics, around an attenuation band, of the second filters according to an example embodiment of the present invention, the first reference example, and the second reference example.

FIG. 12 is a diagram of attenuation frequency characteristics, in a wide frequency range, of the first filters according to the present example embodiment, the first reference example, and a second reference example. FIG. 13 is a diagram of attenuation frequency characteristics, around a pass band, of the first filters according to the present example embodiment, the first reference example, and the second reference example. FIG. 14 is a diagram of attenuation frequency characteristics, in a wide frequency range, of the second filters according to the present example embodiment, the first reference example, and the second reference example. FIG. 15 is a diagram of attenuation frequency characteristics, around an attenuation band, of the second filters according to the present example embodiment, the first reference example, and the second reference example.

As illustrated in FIG. 12 and FIG. 13, in the present example embodiment, the out-of-band attenuation is notably increased further in the than first reference example. Particularly, a high band attenuation is increased around the pass band in the present example embodiment. In the second reference example, the out-of-band attenuation is, over a wide range, almost between the out-of-band attenuation of the first example embodiment and the first reference example. As illustrated in FIG. 14 and FIG. 15, the present example embodiment, the first reference example, and the second reference example have no great difference in terms of attenuation frequency characteristics of the second filter.

The reason why the present example embodiment can increase out-of-band attenuation of the first filter 1A defining and functioning as a band pass filter is as follows. Current flowing through the inductor L4 illustrated in FIG. 10 causes a magnetic field. In the configuration according to the present example embodiment including the overlapping portion, the magnetic field passes through the longitudinally coupled resonator acoustic wave filter 6. In the overlapping portion, the direction in which current flows through the longitudinally coupled resonator acoustic wave filter 6 and the direction in which current flows through the inductor L4 are the same. Thus, electromagnetic coupling between the longitudinally coupled resonator acoustic wave filter 6 and the inductor L4 is improved. Thus, out-of-band attenuation of the first filter 1A can be increased.

The configuration according to the present example embodiment is described further in detail below.

Figure 16:
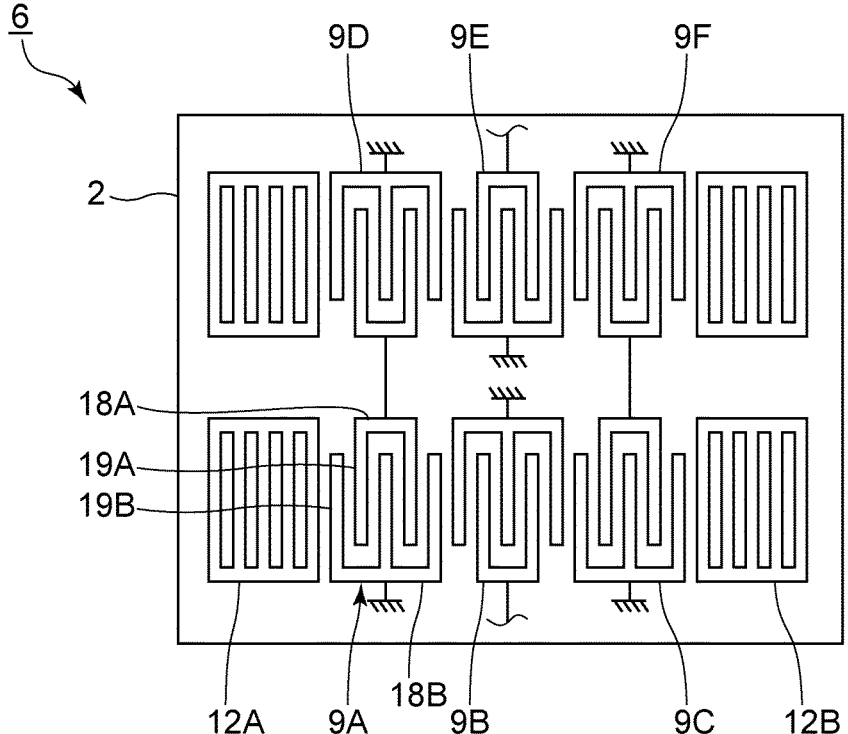
FIG. 16 is a schematic plan view of a longitudinally coupled resonator acoustic wave filter according to an example embodiment of the present invention.

FIG. 16 is a schematic plan view of the longitudinally coupled resonator acoustic wave filter according to the present example embodiment.

Multiple IDT electrodes are disposed on the piezoelectric substrate 2. Applying an alternating-current voltage to the IDT electrodes excites an acoustic wave. As described above, the longitudinally coupled resonator acoustic wave filter 6 has a two-stage configuration. In one of the stages, an IDT electrode 9A, an IDT electrode 9B, and an IDT electrode 9C are arranged in an acoustic wave propagation direction. In addition, a pair of reflectors 12A and 12B are disposed with the three IDT electrodes therebetween in the acoustic wave propagation direction. Similarly, in the other stage, an IDT electrode 9D, an IDT electrode 9E, an IDT electrode 9F, and a pair of reflectors are disposed. The number of electrodes disposed on each stage may be other than three. For example, five, seven, or nine IDT electrodes may be disposed on each stage. Alternatively, the longitudinally coupled resonator acoustic wave filter 6 may have a one-stage configuration.

The IDT electrode 9A includes a first busbar 18A, a second busbar 18B, multiple first electrode fingers 19A, and multiple second electrode fingers 19B. The first busbar 18A and the second busbar 18B face each other. First ends of the multiple first electrode fingers 19A are connected to the first busbar 18A. First ends of the multiple second electrode fingers 19B are connected to the second busbar 18B. The multiple first electrode fingers 19A and the multiple second electrode fingers 19B are interdigitated with one another. The IDT electrodes and the reflectors may each be defined by a laminated metal film, or a single-layer metal film. Herein, the first busbar 18A and the second busbar 18B may be simply and collectively described as busbars. The first electrode finger 19A and the second electrode finger 19B may be simply and collectively described as electrode fingers. The direction in which the electrode fingers extend and the acoustic wave propagation direction are orthogonal or substantially orthogonal to each other.

In each IDT electrode, one of the busbars is connected to the hot potential, and the other busbar is connected to the ground potential. The busbar in one of the stages connected to the hot potential and the busbar in the other stage connected to the hot potential are connected to each other. In the present example embodiment, each reflector is connected to the ground potential. Instead, each reflector does not necessarily have to be connected to the ground potential.

In the longitudinally coupled resonator acoustic wave filter 6, one of the busbars in the IDT electrode 9B is connected to an input wire, and one of the busbars in the IDT electrode 9E is connected to an output wire. The direction in which current flows through the longitudinally coupled resonator acoustic wave filter 6 is parallel or substantially parallel to the electrode fingers of each IDT electrode, and is a direction from the busbar in the IDT electrode 9B connected to the input wire to the busbar in the IDT electrode 9E connected to the output wire.

FIG. 2 schematically illustrates the longitudinally coupled resonator acoustic wave filter 6 including the multiple IDT electrodes and a pair of reflectors with rectangles with two diagonals. As illustrated in FIG. 2, a wire connected to the ground potential and a wire connected to the hot potential partially face each other with an insulator film 17 interposed therebetween. The insulator film 17 electrically insulates the wires from each other. Thus, the wire routing area can be reduced, and the compound filter device 10 can be reduced in size. Instead, the insulator film 17 does not have to be provided.

The other acoustic wave resonators each include one IDT electrode and a pair of reflectors. The pair of reflectors are disposed with the IDT electrode therebetween in the acoustic wave propagation direction.

As illustrated in FIG. 3, the acoustic wave element chip 1 is flip-chip mounted on the mount board 7. More specifically, the terminals disposed on the piezoelectric substrate 2 are joined to the terminals on the first layer 7A of the mount board 7 with bumps 16. A sealing resin layer 11 is also disposed on the mount board 7 to cover the acoustic wave element chip 1.

The resonators in the first filter 1A including the longitudinally coupled resonator acoustic wave filter 6 and the resonators in the second filter 1B are disposed on the same piezoelectric substrate 2. Instead, the resonators in the first filter 1A and the resonators in the second filter 1B may be disposed on different piezoelectric substrates. Thus, an acoustic wave element chip including the first filter 1A and an acoustic wave element chip including the second filter 1B may be mounted on the mount board 7.

Figure 17:
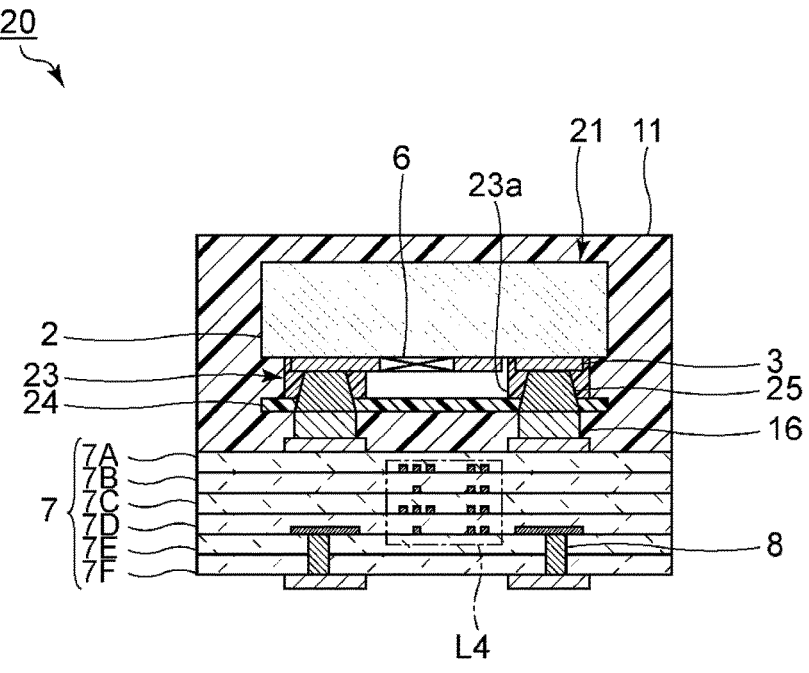
FIG. 17 is a schematic front cross-sectional view of a compound filter device according to a first modified example of an example embodiment of the present invention.

The compound filter device 10 according to the present example embodiment has, for example, a chip size package (CSP) structure. However, the compound filter device is not limited to this configuration. For example, in a first modified example of the first example embodiment illustrated in FIG. 17, a compound filter device 20 has a wafer level package (WLP) structure.

More specifically, in the present modified example, a support member 23 is disposed on the piezoelectric substrate 2 to surround the multiple IDT electrodes. More specifically, the support member 23 includes an opening portion 23*a*. The multiple IDT electrodes are located in the opening portion 23*a*. A cover member 24 is disposed to cover the opening portion 23*a* of the support member 23. The multiple IDT electrodes are disposed in a hollow space defined by the piezoelectric substrate 2, the support member 23, and the cover member 24.

Multiple through electrodes 25 extend through the cover member 24 and the support member 23. A first end of each of the through electrodes 25 is connected to the terminal on the piezoelectric substrate 2. Thus, an acoustic wave element chip 21 is provided. Each bump 16 is joined to a second end of the corresponding one of the through electrodes 25. The acoustic wave element chip 21 is joined to the mount board 7 with the multiple bumps 16. To cover the acoustic wave element chip 21, the sealing resin layer 11 is disposed on the mount board 7. As in the first example embodiment, the present modified example can also increase out-of-band attenuation of the band pass filter.

Referring back to FIG. 3, in the present example embodiment, the inductor L4 is disposed on the second layer 7B to the fifth layer 7E of the mount board 7. More specifically, as illustrated in FIG. 5, the inductor L4 includes a wire portion. The wire portion has a spiral shape. The through electrodes 8 are connected to the end portions of the wire portion. The wire portions of the inductor L4 illustrated in FIG. 5 to FIG. 8 are connected to each other with the through electrodes 8. Thus, the inductor L4 includes the multiple through electrodes 8. The multiple wire portions and the multiple through electrodes 8 define the coil-shaped inductor L4.

The wire portion on each layer of the inductor L4 may have any shape, such as, for example, a linear shape, a letter L shape, or an unwound curve. Preferably, with connection of the wire portions on the layers to one another, the inductor L4 is a coil-shaped inductor.

A first end of the inductor L4 is electrically connected to the ground terminal 5 with the bump 16 and the electrode pad disposed on the first layer 7A interposed therebetween. A second end of the inductor L4 is connected to an external ground potential. More specifically, as illustrated in FIG. 9, a ground electrode 15 is disposed on the sixth layer 7F. The inductor L4 is connected to the ground potential with the ground electrode 15 interposed therebetween.

A common connection electrode 13, a first signal electrode 14A, and a second signal electrode 14B are disposed on the sixth layer 7F. The common connection electrode 13 is electrically connected to the two common connection terminals 3 on the piezoelectric substrate 2 with wires in the mount board 7, the through electrodes 8, and the bumps 16 interposed therebetween. More specifically, the two common connection terminals 3 are used in common on the mount board 7. Similarly, the first signal electrode 14A is electrically connected to the first signal terminal 4A. The second signal electrode 14B is electrically connected to the second signal terminal 4B.

In the present example embodiment, wires connected to the ground electrode are not disposed between the longitudinally coupled resonator acoustic wave filter 6 and the inductor L4. Thus, out-of-band attenuation of the first filter 1A can be effectively increased.

In addition, a subset of the wire portions of the inductor L4 is disposed on the second layer 7B. More specifically, a subset of the wire portions of the inductor L4 is disposed between the first layer 7A and the second layer 7B. The distance between the longitudinally coupled resonator acoustic wave filter 6 and the inductor L4 can thus be reduced. The electromagnetic coupling between the longitudinally coupled resonator acoustic wave filter 6 and the inductor L4 can thus be improved. Out-of-band attenuation of the first filter 1A can thus be further increased.

The wiring structure of the mount board 7 is not limited to the above structure. Preferably, the longitudinally coupled resonator acoustic wave filter 6 and the inductor L4 face each other without wires connected to the ground potential interposed therebetween. Preferably, at least a subset of the wire portions of the inductor L4 is located nearer the piezoelectric substrate 2 with respect to the middle of the mount board 7 in a thickness direction. More preferably, at least a subset of the wire portions of the inductor L4 is located at a portion in the multiple layers in the mount board 7, nearest the piezoelectric substrate 2. Thus, out-of-band attenuation of the first filter 1A can be further increased, as described above.

The pass band of the first filter 1A and the attenuation band of the second filter 1B are in the same frequency range. Thus, out-of-band attenuation of the first filter 1A can be effectively increased. Instead, the pass band of the first filter 1A and the attenuation band of the second filter 1B may be in different frequency ranges.

As in the present example embodiment, preferably, the inductor L4 has a configuration in which the magnetic field, generated when current flows through the inductor L4, is directed from the piezoelectric substrate 2 toward the mount board 7. Thus, out-of-band attenuation of the first filter 1A can be effectively increased.

As described above, the compound filter device 10 is, for example, an extractor. The first filter 1A and the second filter 1B may both be band pass filters.

In the present example embodiment, the inductor L4 defining and functioning as a parallel inductor overlaps the longitudinally coupled resonator acoustic wave filter 6 in a plan view. Instead, the inductor L3 defining and functioning as a series inductor in the second filter 1B may overlap the longitudinally coupled resonator acoustic wave filter 6 in a plan view. The above configuration may be any configuration as long as the direction in which current flows through the longitudinally coupled resonator acoustic wave filter 6 and the direction of current flowing through the inductor L3 are the same in the overlapping portion.

Figure 18:
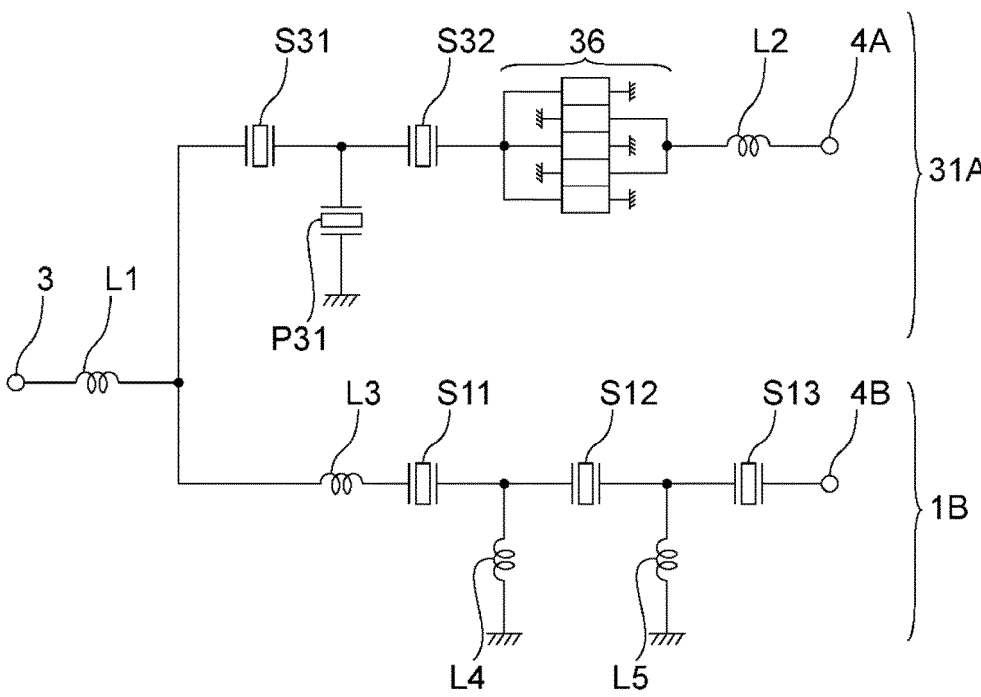
FIG. 18 is a circuit diagram of a compound filter device according to a second modified example of an example embodiment of the present invention.

As described above, the circuit configuration or the configuration of the longitudinally coupled resonator acoustic wave filter 6 is not limited to the configuration according to the above-described example embodiment. For example, in the second modified example of the above-described example embodiment illustrated in FIG. 18, an acoustic wave resonator S31 and an acoustic wave resonator S32 are connected in series between the common connection terminal 3 and a longitudinally coupled resonator acoustic wave filter 36. An acoustic wave resonator P31 is connected between the ground potential and a node between the acoustic wave resonator S31 and the acoustic wave resonator S32. The acoustic wave resonator S31 and the acoustic wave resonator S32 are used as a series trap. The acoustic wave resonator P31 is used as a shunt trap. The longitudinally coupled resonator acoustic wave filter 36 has one stage structure including five interdigital transducers (IDTs).

Also in the present modified example, as in the above-described example embodiment, the direction in which current flows through the longitudinally coupled resonator acoustic wave filter 36 and the direction in which current flows through the inductor L4 are the same in the overlapping portion. Thus, out-of-band attenuation of a first filter 31A defining and functioning as a band pass filter can be increased.

Although a case where the compound filter device 10 is an extractor is described in the above-described example embodiment, this is not the only possible example. A compound filter device according to an example embodiment of the present invention may include at least two band pass filters. These band pass filters may each be a transmission filter that outputs signals received from the transmission terminal to the common connection terminal, or a reception filter that outputs signals received from the common connection terminal to the reception terminal. A compound filter device according to an example embodiment of the present invention may be, for example, a duplexer or a multiplexer.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A compound filter device, comprising:
a piezoelectric substrate;
a first filter defining and functioning as a band pass filter and including a longitudinally coupled resonator acoustic wave filter on the piezoelectric substrate; and
a second filter including at least one resonator, and an inductor connected to a ground potential; wherein
in a plan view, the longitudinally coupled resonator acoustic wave filter and the inductor overlap to define an overlapping portion; and
a direction in which current flows through the longitudinally coupled resonator acoustic wave filter and a direction in which current flows through the inductor are the same in the overlapping portion.

2. The compound filter device according to claim 1, wherein the longitudinally coupled resonator acoustic wave filter in the first filter and the resonator in the second filter are provided on a same piezoelectric substrate.

3. The compound filter device according to claim 1, wherein the second filter is a band elimination filter.

4. The compound filter device according to claim 3, wherein a pass band of the first filter and an attenuation band of the second filter are in a same frequency range.

5. The compound filter device according to claim 1, wherein the longitudinally coupled resonator acoustic wave filter includes two stages each including three interdigital transducers.

6. The compound filter device according to claim 1, wherein the second filter includes a plurality of the inductors.

7. The compound filter device according to claim 1, wherein the piezoelectric substrate includes at least one of lithium tantalate, lithium niobate, zinc oxide, aluminum nitride, crystal, or lead zirconate titanate.

8. The compound filter device according to claim 1, wherein the piezoelectric substrate includes a laminate substrate including a piezoelectric layer.

9. The compound filter device according to claim 1, further comprising:

a mount board; wherein
the first filter and the second filter are mounted on the mount board.

10. The compound filter device according to claim 1, wherein the mount board includes a plurality of laminated layers.

11. A compound filter device, comprising:
a piezoelectric substrate;
a first filter defining and functioning as a band pass filter and including a longitudinally coupled resonator acoustic wave filter on the piezoelectric substrate; and
a second filter including at least one resonator, and an inductor connected to a ground potential; wherein
the longitudinally coupled resonator acoustic wave filter includes a plurality of IDT electrodes on the piezoelectric substrate, the plurality of IDT electrodes each including a plurality of electrode fingers;
in a plan view, the longitudinally coupled resonator acoustic wave filter and the inductor overlap to define an overlapping portion; and
a direction in which the electrode fingers in the longitudinally coupled resonator acoustic wave filter extend and a direction in which current flows through the inductor are the same in the overlapping portion.

12. The compound filter device according to claim 11, wherein the longitudinally coupled resonator acoustic wave filter in the first filter and the resonator in the second filter are provided on a same piezoelectric substrate.

13. The compound filter device according to claim 11, wherein the second filter is a band elimination filter.

14. The compound filter device according to claim 13, wherein a pass band of the first filter and an attenuation band of the second filter are in a same frequency range.

15. The compound filter device according to claim 11, wherein the longitudinally coupled resonator acoustic wave filter includes two stages each including three interdigital transducers.

16. The compound filter device according to claim 11, wherein the second filter includes a plurality of the inductors.

17. The compound filter device according to claim 11, wherein the piezoelectric substrate includes at least one of lithium tantalate, lithium niobate, zinc oxide, aluminum nitride, crystal, or lead zirconate titanate.

18. The compound filter device according to claim 11, wherein the piezoelectric substrate includes a laminate substrate including a piezoelectric layer.

19. The compound filter device according to claim 11, further comprising:
a mount board; wherein
the first filter and the second filter are mounted on the mount board.

20. The compound filter device according to claim 11, wherein the mount board includes a plurality of laminated layers.

* * * * *